Sept. 13, 1966 W. F. BROWN 3,272,994

VARIABLE CAPACITY BINARY COUNTER

Filed May 15, 1964 2 Sheets-Sheet 1

United States Patent Office 3,272,994
Patented Sept. 13, 1966

3,272,994
VARIABLE CAPACITY BINARY COUNTER

William F. Brown, Wappingers Falls, N.Y., assignor to Texaco Inc., New York, N.Y., a corporation of Delaware Filed May 15, 1964, Ser. No. 367,790
13 Claims. (Cl. 307—88.5)

This invention relates to a binary counter and more particularly, to a binary counter in which the counter may be simply and speedily set to count repetitively to a predetermined value.

It is well known in the binary counter art that the count capacity may be simply varied by presetting a count into the counter which is the complement of the desired count capacity. The new capacity can be made repetitive by reinserting the same complement count into the counter at the time of an output pulse therefrom by means of a feedback signal. The most popular use of this technique is to convert a four-state binary counter capable of counting to 16 to a decimal (10) counter. This is accomplished by feeding the output pulse produced by the fourth or last stage of the counter back to the appropriate stages of the counter to introduce a count which is the complement of the desired counter capacity. More specifically, a feedback path would be connected from the output to both the second and third stages of the binary counter so as to introduce a count of 6 therein which is the complement of 10, the desired count capacity. In order to change the counting capacity of the counter to some other predetermined value other than 10 but less than $2^n$, where $n$ is equal to the number of stages in the counter, a feedback rewiring would be necessary or new wiring connections could be accomplished by a switching arrangement to set up the proper feedback connections to introduce the complement of the desired count.

The present invention provides a simple circuit arrangement used in conjunction with a binary counter which provides a simple and speedy means of varying the capacity of the counter to any predetermined value less than $2^n$.

Accordingly, it is an object of this invention to provide a simple circuit means for varying the count capacity of a binary counter.

It is another object of the present invention to provide a binary counter which automatically resets to a count which is the complement of the predetermined counter capacity.

It is a further object of the invention to provide a binary counter which can be preset for any count capacity less than $2^n$ without knowing the complement of the desired count capacity.

It is another object of the invention to provide a binary counter which automatically adjusts its capacity to continually repeat whatever count there is in the counter at the time of selection.

It is a further object of the invention to provide a binary counter which automatically adjusts its capacity to continually provide a count which is one count greater than the count that is in the counter at the time of selection.

According to the invention, there is provided a binary pulse counter having a plurality of cascaded two-state circuits in combination with means for providing a predetermined count capacity of the counter. Means are provided, separate from the counter input means, for reversing the states of the two-state circuits. Also included in the combination are means for sampling the state of each of said two-state circuits and for preventing the reversal by said reversing means of the two-state circuits having a predetermined state when sampled. The reversing means are responsive to a counter output pulse to reverse the two-state circuits not having said predetermined state when sampled and thereby automatically resetting the counter to have the predetermined count capacity.

The invention will be described in more detail below with reference to the accompanying drawings wherein.

Figure 1:
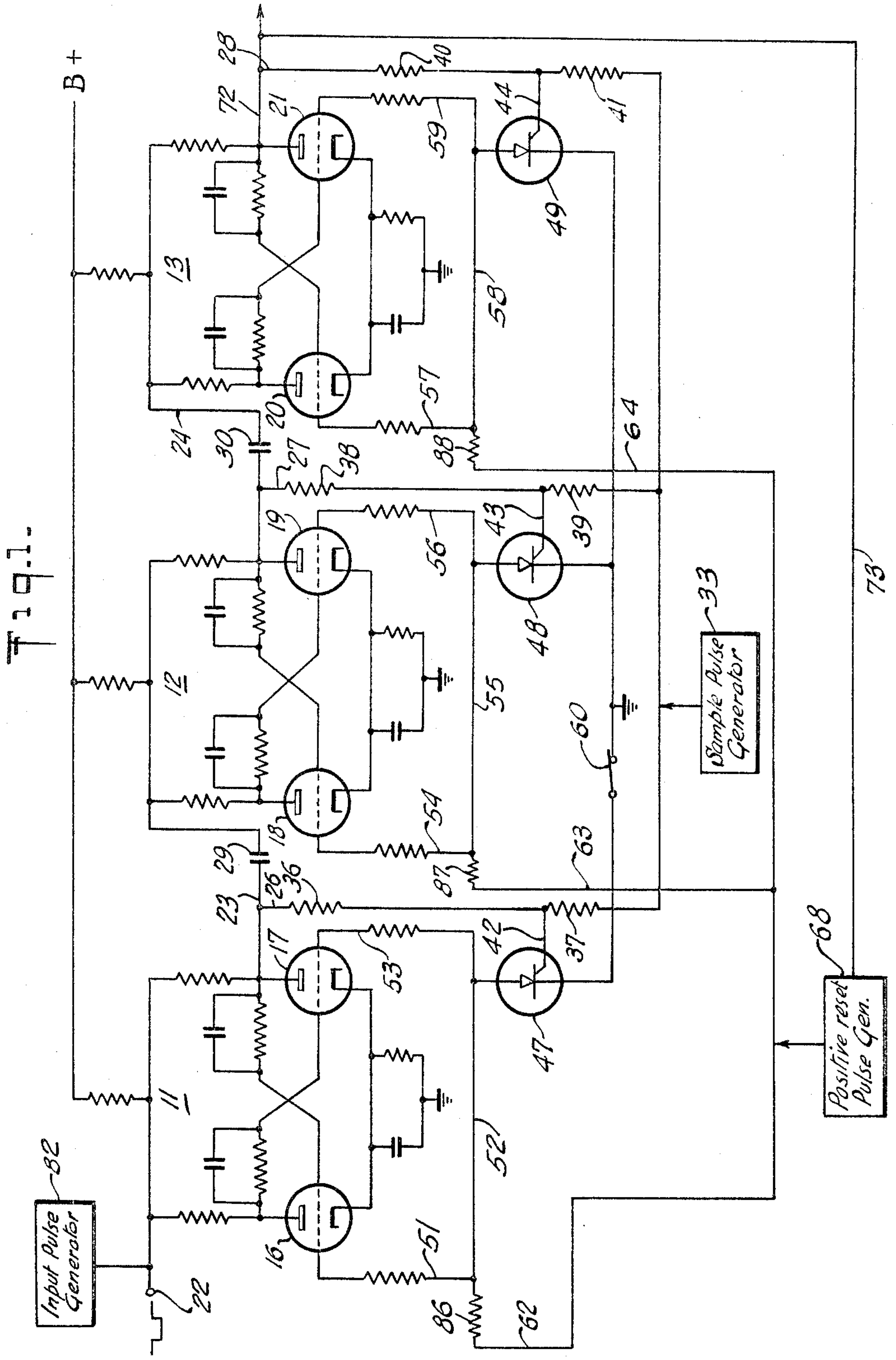
FIG. 1 is a detailed circuit diagram of the binary counter showing the feedback circuit and controls.

Referring to FIG. 1, there is shown in detail a binary counting circuit consisting of three stages 11, 12 and 13. Each stage is substantially the same and consists of a conventional "flip-flop" or "trigger" circuit of the general type described on pages 206–210 of "Theory and Applications of Electron Tubes" by Herbert J. Reich, McGraw-Hill (1939).

Briefly, each of the trigger circuits 11, 12 and 13 consists of a pair of vacuum tubes 16 and 17, 18 and 19, and 20 and 21, respectively. The plates of each of the vacuum tubes are connected through resistance capacitance coupling means to the grid of the other tube of the pair. The cathode of each of the tubes is grounded through an appropriate resistor capacitor network. A trigger circuit has two states determined by which of the tubes of the pair is conducting. In our particular embodiment of the invention, the right hand tube conducting and the left hand tube cut-off represents the "0" condition or "off" state of the trigger circuit. Accordingly, the "1" condition or "on" state will be represented by the left hand tube conducting and the right hand tube cut off. The tube parameters are arranged such that the state or conducting conditions of the tubes will change as a result of negative pulses applied to the plate and grid circuits thereof. Accordingly, tne pulses received at terminal 22 to be counted are negative.

The negative pulse is applied to the plate and grid circuits of both tubes of a pair of tubes simultaneously. The negative pulse will produce a diminishing of current flow in the conducting tube of the pair. This in turn will produce an increase in voltage at the plate of the conducting tube which increase is coupled through resistance capacitance coupling circuits to the grid of the opposite tube. This positive increase in the bias on the control grid is sufficient to start conduction in this tube of the pair, thus dropping the voltage in its plate circuit to further add to the drop in bias on the control grid of the original conducting tube thereby completing the cut-off thereof and the change over of conduction to the other tube of the pair.

The trigger circuits 11, 12 and 13 when connected in cascade to form a binary counter have leads 23 and 24, respectively, connected from the plate of the right hand tube to the input of the next trigger circuit. Each lead 23 and 24 contains a coupling capacitor 29 and 30, respectively.

It will be appreciated that the cascaded trigger circuits act as a frequency divider in that the first stage 11 produces an output pulse for every two input pulses at 22 while the second stage 12 produces an output pulse for every four input pulses at 22 and the third trigger stage 13 produces an output pulse for every eight input pulses at 22. Thus, the progression can be carried out for the desired number of stages and the output pulse will be obtained for every $2^n$ inputs where $n$ equals the number of cascaded trigger stages. In the embodiment depicted in FIG. 1, the counter has three stages 11, 12 and 13 and, therefore, would produce an output pulse every $2^3$ input pulses or eight input pulses. However, in many applications, it is desired to count to some other integer other than a power of 2, for example, 5. The counter of the instant invention is capable of being preset to provide an output pulse upon the receipt of any predetermined number of input pulses less than $2^n$ which is the maximum count capacity for the number of stages involved.

In order to preset the counter to have a predetermined capacity, there is connected to the plate circuits of tubes 17, 19 and 21 leads 26, 27 and 28 for trigger circuits 11, 12 and 13, respectively. Each of the leads 26, 27 and 28 is connected at the other end thereof to a sample pulse generator 33. The sample pulse generator 33 may be any conventional pulse generator capable of producing a positive pulse of short duration upon being energized. The details of the pulse generator per se, form no part of this invention and accordingly, a detailed description thereof would serve no purpose in connection with the present invention. The sample pulse generator 33 may be programmed to automatically produce the pulse when a predetermined count has been established in the counter. In a usage where speed is not of significance, the pulse could be triggered by manual means. A resistive network consisting of resistors 36 and 37 is located in lead 26. Likewise, resistive networks 38, 39 and 40, 41 are located in leads 27 and 28, respectively. Connected to the junction of the resistive networks in each of the leads 26, 27 and 28, is the control electrode 42, 43 and 44 of silicon controlled rectifiers 47, 48 and 49, respectively. The plates of the silicon controlled rectifiers 47, 48 and 49 are connected via leads 51, 52 and 53; 54, 55 and 56; and 57, 58 and 59 to control electrodes of both tubes in each trigger circuit 11, 12 and 13, respectively. The cathode electrode of each silicon controlled rectifier is connected to ground through a common resetting switch 60. It can be seen that opening switch 60 will cause each silicon controlled rectifier to reset. A positive reset pulse generator 68 is connected to the grid circuit of each tube of the trigger circuits 11, 12 and 13 by means of electrical leads 62, 63 and 64 containing resistors 86, 87 and 88, respectively. The silicon controlled rectifier is a device which may be triggered into conducting condition by a pulse of the right polarity on the control electrode and which will remain conducting until the device is turned off. An output 72 is taken from the plate of the right hand tube of the last trigger circuit in the counter. A lead 73 is connected between the output 72 of the counter to the positive reset pulse generator 68.

Figures 2, 3:
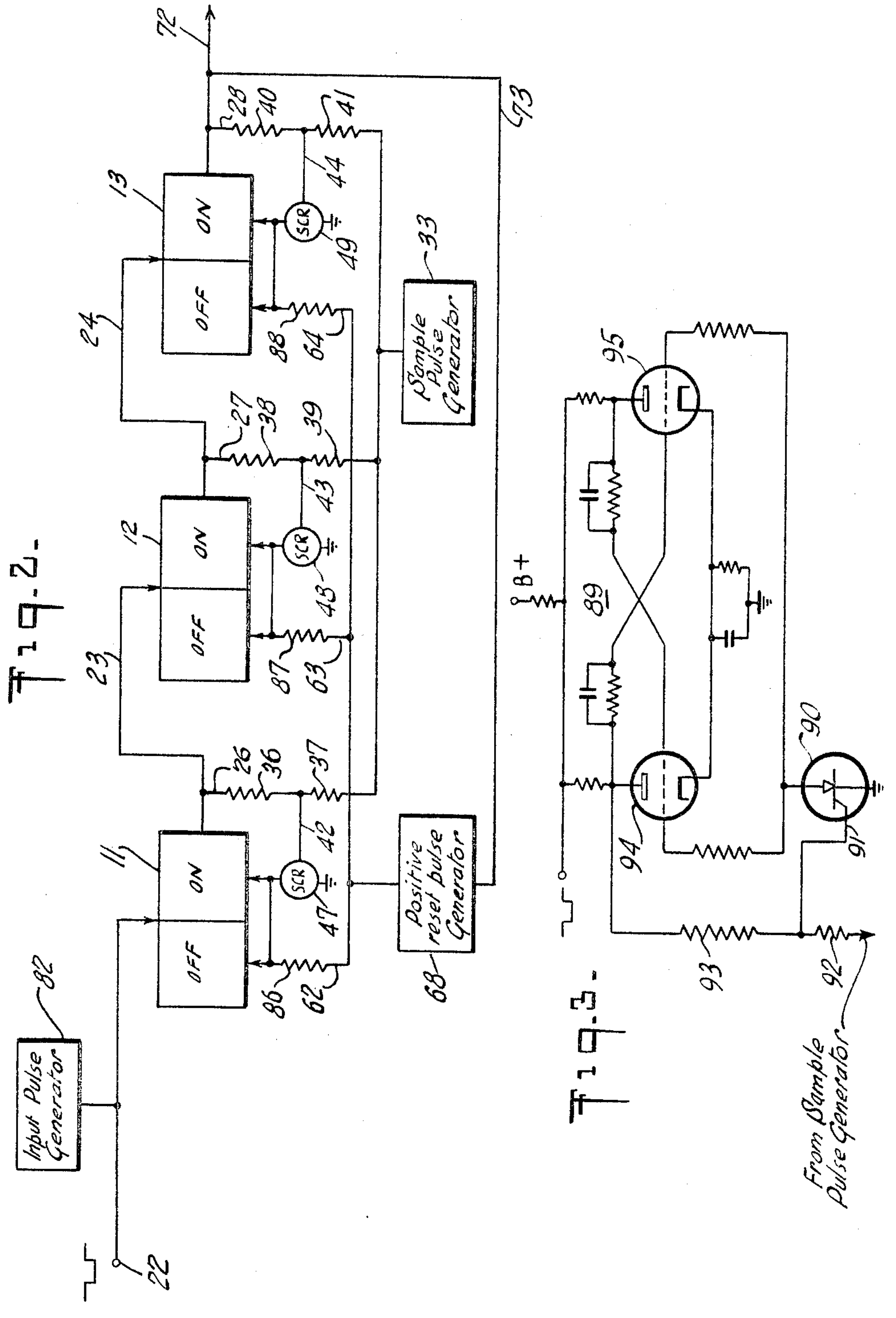
FIG. 2 is a schematic representation of the binary counter and the feedback circuit and controls showing the "ON" and "OFF" states for trigger circuits representing zero counts registered in the counter.
FIG. 3 is a detailed circuit diagram of one of the trigger circuits of the binary counter showing the control grid of the silicon controlled rectifier connected to the left hand plate of the trigger circuit.

The operation of the counter and the presetting thereof to have a predetermined count capacity can be more clearly followed by reference to FIG. 2 where corresponding elements to those shown in FIG. 1 are designated by the same reference numerals. In order to preset the binary counter to have a predetermined count capacity, a count one less than the desired count capacity is inserted by means of input pulse generator 82. For example, selecting 5 as the desired count capacity of the counter, four pulses would be generated by input pulse generator 82 in response to a manual energization or setting. The initial condition of each trigger stage of the binary counter is "off" or the "0" state as shown in FIG. 2 by the previously mentioned on-off conditions of the amplifier tubes of the trigger pair. Thus, it can be seen that the first input pulse from the input pulse generator 82 will cause trigger circuit 11 to change state or reverse its condition to represent the "on" or "1" condition. The second input pulse will cause trigger circuit 11 to revert to its initial state and simultaneously will cause a negative output pulse on connector 23 which pulse causes a change of state of the second trigger stage 12. The third pulse from pulse generator 82 again causes a change of state of trigger circuit 11, while the fourth input pulse causes trigger circuit 11 to revert to its initial state again producing an output pulse on connector 23 which causes the second trigger circuit 12 to revert to its initial condition and in turn, to produce a pulse on output lead 24 which changes the state of the third trigger circuit 13. Thus, the four input pulses result in the first two trigger circuits 11 and 12 being in their "off" or "0" condition while the third trigger circuit is in its "on" or "1" condition. At this time, the sample pulse generator 33 is energized to produce a positive sample pulse on leads 26, 27 and 28. The sample pulse generator 33 upon energization produces a positive voltage pulse of sufficient amplitude which in conjunction with the resistive network consisting of resistors 36 and 37, 38 and 39, and 40 and 41 (see FIG. 1) when the plate of the right hand amplifying tube 17, 19 and 21 is at its high positive potential produces conduction in the associated silicon controlled rectifier popularly known and referred to hereinafter as an SCR. This is the case when the right hand tube 17, 19 or 21 is nonconducting or the trigger circuit is in its "on" or "1" condition. Thus SCR 47, 48 or 49 will be rendered conducting by the sample pulse generator pulse only when the SCR control electrode is connected to a high potential plate or nonconducting tube of the trigger circuit. In our example, therefore, only SCR 49 which is associated with a trigger circuit in the "1" state will be triggered to its conducting condition. The next step in the pre-setting is to energize the positive reset pulse generator 68 so as to provide a reset pulse to the grid circuits of each trigger circuit 11, 12 and 13 via leads 62, 63 and 64. However, any conducting SCR will provide in conjunction with resistors 86, 87 and 88, respectively, an attenuating effect on the positive reset pulse and consequently, the trigger circuit associated with a conducting SCR will not be reset by the positive reset pulse. It should be noted that each of the trigger circuits not associated with a conducting SCR is in the "0" state. Thus, the positive reset pulse causes each of these trigger circuits to change state. Accordingly, all the trigger circuits 11, 12 and 13 are now in the "1" state. Inserting one further pulse by means of input pulse generator 82 causes all of the trigger circuits 11, 12 and 13 to revert to their "0" state.

The change of state of the last trigger circuit 13 to "0" produces an output pulse on lead 72 which is applied to positive reset pulse generator 68 via lead 73. This feedback pulse energizes the positive reset pulse generator 68 to produce a positive reset pulse which is applied to the grid circuits of each trigger circuit 11, 12 and 13. It will be appreciated that the trigger circuits are all in their "0" condition before the arrival of the positive reset pulse. Hence, the positive reset pulse will cause a change of state of each of the trigger circuits except for the trigger circuits associated with a conducting SCR, in our example, trigger circuit 13. Thus the counter has only one trigger circuit left in the "0" condition. The binary counter is now set to count to the desired capacity, namely 5. This will be clarified by an analysis of the condition of the counter. The counter presently contains the binary count 011 which in binary notation represents the numeral 3. Since the full capacity of the counter is 8, it can be seen that five input pulses will cause full capacity to be reached and an output pulse to be produced at the counter output which again will reset the counter to 011 by energizing the positive reset pulse generator 68 to produce a positive reset pulse, which causes the trigger circuits not associated with a conducting SCR to reverse state. Accordingly, the counter will repeatedly count to 5.

Referring to FIG. 3, there is shown a trigger circuit 89 similar to the trigger circuits of FIG. 1. The SCR 90 of this trigger circuit has its control electrode 91 connected to the plate of the left hand tube 94 rather than the plate of right hand tube 95 as was the case in the previously described embodiment. The control electrode 91 is connected to the junction of a resistance network 92, 93 whose resistance values are selected so that the control electrode will be sufficiently positive to cause conduction of the SCR when a sample pulse is received from the sample pulse generator and the associated trigger circuit is in the "0" state.

A different procedure is used to preset a counter having the SCR controlled from the left hand plate to count to a predetermined capacity. The advantage of this arrangement, in some situations, is that a spurious output pulse is not produced by the counter during set up as was the case in the previously described procedure. In this set up procedure, again a number of pulses which is one less than the desired count capacity of the counter is generated by input pulse generator 82 and applied to the counter. However, before sample pulse generator 33 is energized, positive reset pulse generator 68 is energized to produce a positive reset pulse which will produce a reversal of the state of each of the trigger circuits. The counter now contains a binary count which is the complement of the desired count capacity. Providing a sample pulse by energization of the sample pulse generator, each SCR associated with a trigger circuit which is in the "OFF" or "0" state will be triggered to a conducting condition. The circuit is now ready to receive input pulses to be counted and will count or produce an output pulse for the predetermined number of pulses to which the capacity of the counter has been set. Returning to our example wherein the predetermined desired capacity of the counter has been selected as five, inserting four pulses by means of manual input pulse generator 82 will place the trigger circuits into a condition represented by 100 as has been previously explained. The reversing to each of the trigger circuits upon receiving a pulse produced by the energization of positive reset pulse generator 68 will result in the counter now containing a count equivalent to binary 011 or decimal 3. It should be noted that this is the same condition in which the counter was placed by the set up procedure discussed in connection with the previous embodiment. As mentioned previously, the binary number 011 or decimal 3 is the complement of the predetermined count capacity five. Accordingly, after receiving five pulses at the input 22 the counter will produce an output pulse at 72 which will energize positive reset pulse generator 68 to produce a positive pulse which will reset all trigger circuits not associated with a conducting SCR. In our example, trigger circuits 11 and 12 will be reset to the "on" or "one" state while trigger circuit 13 will be clamped by means of the conducting SCR from being reversed by a positive pulse. Thus, the counter again contains the complement of the desired count capacity.

A third set up procedure can be utilized to preset a counter having the SCR controlled from the left hand plate to count to a predetermined capacity. This arrangement not only has the advantage of the previous arrangement in that a spurious output pulse is not produced by the counter during set up, but has the further advantage that the counter can be controlled to continually reproduce whatever count is in the counter when the procedure is initiated. Accordingly, in this set up procedure a number of pulses equal to the desired count capacity would be entered in the counter. This could be accomplished by means of input pulse generator 82 or this procedure could be initiated when that number of pulses is in the counter to which the capacity is to be set or that arbitrary number of pulses which happens to be in the counter when the presetting procedure is initiated. The procedure would consist of energizing positive reset pulse generator 68 so as to produce a positive reset pulse which, as described previously, will produce a reversal of the state of each of the trigger circuits. The counter now contains a binary count which is one less than the complement of the desired count capacity. Accordingly to ensure accuracy of the count, it is necessary at this time to add one pulse to the counter by input pulse generator 82. The counter now contains the complement of the count capacity to which the counter is being set. The sample pulse generator is now initiated to provide a sample pulse which triggers each SCR to a conducting condition if it is associated with a trigger circuit which is in the "off" or "zero" state. The counter is now in condition to receive further input pulses to be counted from the input 22 and will produce an output pulse when the predetermined number of pulses to which the capacity of the counter has been set is reached. Referring to the same example as has been described in connection with the two previous procedures, that is, the example where the predetermined desired capacity of the counter has been selected as 5. In the present arrangement, either the five pulses are inserted by means of reset pulse generator 82 or the procedure may be instituted after five pulses have been received at input 22. The condition of the counter when it contains these five pulses is represented by binary number 101 which is the binary equivalent of decimal number 5. The reversing of each of the trigger circuits upon receiving a pulse produced by the energization of positive reset pulse generator 68 will result in the counter now containing a count equivalent to binary 010 which equals 2. It should be noted that this binary number is one less than the binary number obtained by the equivalent steps in the prior procedure and in our example, is one less than the desired complement number. Accordingly in this procedure, if absolute accuracy is necessary, a further step of introducing a single pulse into the input of the counter is necessary to obtain the true complement of the number originally in the counter. The counter is now in the proper condition to receive the further pulses to be counted at the input and will accordingly produce an output pulse after receiving five input pulses, the desired count capacity. The output pulse at 72 is fed back by means of electrical connection 73 as previously described to positive reset pulse generator 68. The positive reset pulse generator 68 produces a positive pulse which resets all the trigger circuits not associated with a conducting SCR. In our example, trigger circuit 11 and 12 will be reset to the "on" or "1" state while trigger circuit 13 will be clamped by means of a conducting SCR from being reversed by a positive pulse. Thus, the counter again contains the complement of the desired count capacity and is in condition to count and produce an output when the desired count capacity is reached.

It will be appreciated that the last two procedures described provide a simple high speed means of controlling the counter so that it counts to a particular count capacity. Furthermore, it can be seen that the count capacity of the counter can be readily varied to any capacity less than $2^n$. The various steps in the set up which have been described as being initiated by manual means, of course, can be produced automatically. In such a case, the count capacity of the counter could be changed in the time that exists between the reception of the pulses.

It will be appreciated that there are other arrangements of the variable capacity binary counter which could be used and still fall within the scope of the invention. For example, the opposite designation of the "on" and "off" conditions of the trigger circuits of the counter could be selected.

It should also be noted that the invention is not limited to the use of an SCR as the normally non-conducting device but that other devices which can be switched quickly can be used such as thyratron tubes.

Obviously, many modifications and variations of the invention, as hereinbefore, set forth, may be made without departing from the spirit and scope thereof, and therefore only such limitations should be imposed as are indicated in the appended claims.

I claim:

1. In a binary pulse counter having an input, an output and a plurality of cascaded two-state circuits; the combination comprising means for providing a predetermined count within said counter, means separate from the counter input for reversing the state of said two-state circuits, means for sampling the state of each of said two-state circuits, means for providing an output pulse from said counter when a full capacity count in said counter has been reached, means for energizing said reversing means to provide a further reversal of said two-state circuits upon receipt of said output pulse from said counter, and means for preventing said further reversal of said two-state circuits having a predetermined state when sampled by said sampling means, thereby setting the counter to repetitively count to a capacity determined by said predetermined count.

2. In a binary pulse counter having $2^n$ stable states and $n$ cascaded two-state circuits, the combination comprising means for establishing in said counter the stable state representing a number which is one less than the predetermined count capacity to which the counter is being set, a plurality of normally non-conducting devices each associated with a respective one of said two-state circuits, means for sampling the state of each of said two-state circuits and for providing conduction of the normally non-conducting devices in accordance with a predetermined state of the associated two-state circuit when sampled by said sampling means, means for reversing the state of each of said two-state circuits, means including said conducting normally non-conducting devices for preventing the reversal by said reversing means of the two-state circuits associated with a conducting normally non-conducting device, means for providing an output pulse from said counter in response to a further input pulse, feedback means for connecting the counter output pulse means to said reversing means for carrying said output pulse from said counter to said reversing means for energizing said reversing means to reverse the two-state circuits not prevented by said preventing means, thereby setting said counter to contain a count which is the complement of the count capacity to which the counter is being set so that the counter will repetitively count to the predetermined count capacity.

3. In a binary pulse counter according to claim 2, wherein each of said normally non-conducting devices associated with a respective one of said two-state circuits is a silicon controlled rectifier.

4. In a binary pulse counter according to claim 2, wherein said predetermined state of the associated two-state circuit which when sampled provides conduction of the normally non-conducting device is the "on" or "1" state.

5. In a binary pulse counter having $2^n$ stable states and $n$ cascaded two-state circuits, the combination comprising means for establishing in said counter the stable state representing a number which is one less than the predetermined count capacity to which the counter is being set, a plurality of normally non-conducting devices each associated with a respective one of said two-state circuits, means for reversing the state of each of said two-state circuits so that the counter contains a binary count which is the complement of the count capacity to which the counter is being set, means for sampling the state of each of said reversed two-state circuits and for providing conduction of the associated normally non-conducting device in accordance with a predetermined state of the associated two-state circuit, means for providing an output pulse from said counter indicating a full capacity count, means energizing said reversing means in response to said counter output pulse to provide a further reversal of said two-state circuits, and means including said conducting normally non-conducting devices for preventing the further reversal by said reversing means of the two-state circuits associated with a conducting normally non-conducting device so that the counter is automatically reset to contain the binary number which is the complement of the count capacity to which the counter has been set.

6. In a binary counter according to claim 5, wherein said predetermined state of the associated two-state circuit which when sampled provides conduction of the normally non-conducting device is the "off" or "zero" state.

7. In a binary pulse counter having $2^n$ stable states and $n$ cascaded two-state circuits, the combination comprising negative pulse input means for setting said counter to a stable state representing a predetermined binary number, positive pulse generating means completely separate from said negative pulse input means connected to said two-state circuits for providing positive pulses to reverse the state of said two-state circuits, means for sampling the state of each of said reversed two-state circuits, means for providing an output pulse in response to a full capacity count in said counter, feedback means for connecting the counter output pulse means to said positive pulse generating means for carrying said output pulse from said counter to said positive pulse generating means and for energizing said positive pulse generating means to provide positive pulses for reversing said two-state devices, means for attenuating the positive pulses applied to said two-state circuits which are in a predetermined state when sampled by said sampling means to prevent reversal thereof, thereby automatically resetting the counter to have a count capacity determined by said predetermined binary number.

8. In a binary pulse counter having $2^n$ stable states and $n$ cascaded two-state circuits the combination comprising negative pulse input means for setting said counter to a stable state representing a predetermined binary number, a plurality of normally non-conducting devices each associated with a respective one of said two-state circuits, means for sampling the state of each of said two-state circuits and for providing conduction of the normally non-conducting device in accordance with an "on" conducting state of the associated two-state circuit, means separate from the counter input means for introducing a positive polarity voltage pulse for reversing the state of each of said two-state circuits, means including said conducting normally non-conducting device for clamping said positive polarity voltage pulse sufficiently to prevent the associated "on" two-state circuit from being reversed thereby, means for inserting a further negative pulse to the input of said counter to cause a reversal of all of the two-state circuits to the "off" conducting condition thereby producing an output pulse from said counter, means responsive to said counter output pulse for energizing said means for introducing a positive polarity pulse to provide a further positive polarity voltage pulse for reversing the state of each of said two state circuits, and means including said conducting normally non-conducting device for clamping said further positive polarity voltage pulse to prevent the associated two-state circuit from being reversed, thereby establishing a stable state of the counter which represents a binary number which is the complement of the predetermined count capacity.

9. In a binary pulse counter having $2^n$ stable states and $n$ cascaded two-state circuits, the combination comprising negative pulse input means for setting said counter to a stable state representing one less than the predetermined count capacity to which said counter is being set, positive polarity pulse generation means completely separate from said negative pulse input means for introducing a positive polarity voltage pulse to said two-state circuits to provide reversing of the state of each of said two-state circuits, a plurality of normally non-conducting devices each associated with a respective one of said two-state circuits, means for sampling the state of each of said two state circuits and for causing the normally non-conducting device to conduct in accordance with an "off" conducting state of the associated two-state circuit, means for producing an output pulse from said counter, means for energizing said positive polarity pulse generating means in response to said output pulse from said counter to generate a further positive pulse for reversing said two-state circuits, means including said conducting normally non-conducting device for preventing the reversal of the associated two-state circuit which were in said "off" conducting state when sampled, thereby automatically resetting said counter to have the predetermined count capacity.

10. In a binary pulse counter having $2^n$ stable states and $n$ cascaded two-state circuits, the combination comprising negative pulse generating means providing negative pulses for said counter to establish a stable state therein representing a binary number equivalent to the count capacity to which the counter is to be set, a plurality of normally non-conducting devices each associated with a respective one of said two-state circuits, positive pulse generating means completely separate from said negative pulse generating means and connected to said two-state circuits providing positive pulses to reverse the state of each of said two-state circuits, said negative pulse generating means including means for providing a single pulse to said counter after said reversal by said reversing means, means for sampling the state of each of said reversed two-state circuits and for providing conduction of said normally non-conducting device in accordance with an "on" state of the associated two-state circuit, means including said conducting normally non-conducting devices for preventing further reversals of said associated two-state circuits, means for providing an output pulse from said counter, feedback means connecting the output of said counter to said reversing means for carrying said output pulse indicating a full capacity count in said counter from said counter to said reversing means for energizing said reversing means to cause a further reversal of said two-state circuits, means including said conducting normally non-conducting device preventing said further reversal of said associated two-state circuit which were in the "on" conducting state when sampled, so that the counter is automatically reset to contain the binary number which is the complement of the count capacity to which the counter has been set.

11. In a binary pulse counter having $2^n$ stable states and $n$ cascaded two-state circuits in which the "zero" stable state is represented by a non-conducting first amplifying device and a conducting second amplifying device, the combination comprising negative pulse generating means for providing negative pulses to said counter to establish the stable state therein representing a number which is one less than the predetermined count capacity to which the counter is being set, a plurality of normally non-conducting devices each of which is connected to a second amplifying device of a respective one of said two-state circuits, means for sampling the state of each of said two-state circuits and for providing conduction of each normally non-conducting device which is connected to a non-conducting second amplifying device, said sampling means including a voltage divider having one end thereof connected to said second amplifying device of each of said two-state circuits and the other end thereof connected to a sample pulse generating means, said normally non-conducting devices being connected to a junction point in said voltage dividers, means for reversing the state of each of said two-state circuits, said conducting normally non-conducting devices and said respective voltage dividers preventing the associated two-state circuits from being reversed, means for providing an output pulse from said counter in response to a further input pulse, feedback means connecting the output of said counter to said reversing means for carrying said output pulse from said counter to said reversing means for energizing said reversing means to cause a further reversal of said two-state circuits, said conducting normally non-conducting devices preventing said further reversal of said associated two-state circuits, thereby setting said counter to contain a count which is the complement of the count capacity to which the counter is being set so that the counter will repetitively count to the predetermined count capacity.

12. In a binary pulse counter having $2^n$ stable states and $n$ cascaded two-state circuits in which the "zero" stable state is represented by a non-conducting first amplifying device and a conducting second amplifying device, the combination comprising negative pulse generating means for providing negative pulses to said counter to establish therein the stable state representing a number which is one less than the predetermined count capacity to which the counter is being set, a plurality of normally non-conducting devices each of which is connected to a first amplifying device of a respective one of said two-state circuits, means for reversing the state of each of said two-state circuits so that the counter contains a binary count which is the complement of the count capacity to which the counter is being set, means for sampling the state of each of said two-state circuits and for providing conduction of the associated normally non-conducting device when the first amplifying device of each of said two-state circuit is in the non-conducting condition, each of said sampling means including a voltage divider having one end thereof connected to a first amplifying device of a respective one of said two-state circuits and the other end thereof connected to a source of sample pulses, said normally non-conducting devices being connected to a junction point in said respective voltage dividers, means for providing an output pulse from said counter, feedback means for applying said output pulse from said counter to said reversing means for energizing said reversing means to cause a further reversal of said two-state circuits, means including said conducting normally non-conducting device preventing said further reversal of said associated two state circuits, thereby presetting said counter to automatically reset to the binary number which is the complement of the count capacity to which the counter has been set.

13. In a binary pulse counter having $2^n$ stable states and $n$ cascaded two-state circuits in which the "zero" stable state is represented by a non-conducting first amplifying device and a conducting second amplifying device, the combination comprising negative pulse generating means for providing negative pulses at the input of said counter to establish a stable state therein representing a binary number equivalent to the count capacity to which the counter is to be set, a plurality of normally non-conducting devices each of which is connected to the first amplifying device of a respective one of said two-state circuits, positive pulse generating means completely separate from said negative pulse generating means and connected to said two-state circuits for providing positive pulses to reverse the state of each of said two-state circuits, said negative pulse generating means including means for providing a signal pulse to said counter after said reversal by said reversing means, means for sampling the state of each of said two-state circuits, said sampling means including a plurality of voltage dividers each having one end connected to said first amplifying device of a respective one of said two-state circuits and the other end thereof connected to a source of positive sample pulses, said normally non-conducting devices being connected to a respective junction point in each of said voltage dividers, means for providing an output pulse from said counter, and feedback means for applying said output pulse from said counter to said reversing means to cause a further reversal of said two-state circuits, means including said conducting normally non-conducting devices preventing said further reversal of said associated two-state circuits, thereby presetting said counter to automatically reset to the binary number which is the complement of the count capacity to which the counter has been set.

References Cited by the Examiner

UNITED STATES PATENTS

| | | | |
|---|---|---|---|
| 2,410,156 | 10/1946 | Flory | 328—48 X |
| 2,697,549 | 12/1954 | Hobbs | 328—51 X |
| 2,771,550 | 11/1956 | Hampton | 328—48 X |
| 3,078,417 | 2/1963 | Nick | 328—45 |

ARTHUR GAUSS, *Primary Examiner.*

I. C. EDELL, *Assistant Examiner.*